(12) United States Patent
Sabouri et al.

(10) Patent No.: US 6,731,166 B1
(45) Date of Patent: May 4, 2004

(54) POWER AMPLIFIER SYSTEM WITH MULTIPLE PRIMARY WINDINGS

(75) Inventors: Faramarz Sabouri, Lawrenceville, NJ (US); Reza Shariatdoust, Califon, NJ (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/994,247

(22) Filed: Nov. 26, 2001

(51) Int. Cl.[7] .............................. H03F 3/68; H03F 3/45; H03F 1/00
(52) U.S. Cl. ...................... 330/124 R; 330/69; 330/165
(58) Field of Search .............................. 330/69, 124 R, 330/165, 195

(56) References Cited

U.S. PATENT DOCUMENTS

| | | | | |
|---|---|---|---|---|
| 3,652,947 A | * | 3/1972 | Hollingsworth | 330/276 |
| 3,652,948 A | * | 3/1972 | Fierstien et al. | 330/276 |
| 3,778,730 A | * | 12/1973 | Cromwell et al. | 331/109 |
| 3,934,213 A | * | 1/1976 | Stuckert | 333/112 |
| 4,614,914 A | * | 9/1986 | Hofer | 330/149 |
| 6,028,479 A | * | 2/2000 | Babanezhad | 330/253 |
| 6,160,455 A | * | 12/2000 | French et al. | 330/297 |

* cited by examiner

Primary Examiner—Patricia Nguyen
(74) Attorney, Agent, or Firm—Gauthier & Connors LLP

(57) ABSTRACT

The invention provides a power amplifier system including a plurality of amplifiers, a plurality of primary transformer windings, a single secondary transformer winding. Each of the plurality of amplifiers includes a differential input that is commonly coupled to a system input port, and each the plurality of amplifiers also includes a differential output. Each of the plurality of primary transformer windings is coupled to the differential output of one of the plurality of amplifiers. The single secondary transformer winding is inductively coupled to all of the primary transformer windings and provides a system output port to which a load may be coupled.

20 Claims, 2 Drawing Sheets

POWER AMPLIFIER SYSTEM WITH MULTIPLE PRIMARY WINDINGS

BACKGROUND OF THE INVENTION

The invention relates to the use of power amplifiers, and particularly relates to using transformers to couple a power amplifier to a load.

Employing transformers to couple a power amplifier to a load generally permits any desired voltage transformation to be achieved within an operating range. Amplifiers with relatively small supply voltages may provide large voltage swings across the load. Moreover, transformers may act as impedance matching networks in certain applications to achieve maximum power transfer to the load.

As shown in FIG. 1, a conventional power amplifier system employing a transformer to couple a power amplifier 10 to a load 12 involves a transformer 14 having a primary winding 16 and a secondary winding 18 that provides a turns ratio of N:1 as indicated. Generally, the choice of N depends on the voltage and current requirements of the load, as well as the voltage and current ratings of the amplifier 10.

Although it is desirable to provide wide swings of output current for certain applications, a large turns ratio as well as large voltage swings are generally needed to provide the large output current. Further, systems that employ a large turns ratio to provide the high current (and power) output generally result in the generation of substantial heat that must be dissipated as evenly as possible, particularly if the system or circuit includes thermally sensitive components.

There is a need therefore, for an amplifier system that provides large current swings. There is a further need for such an amplifier system that reduces localized heating.

SUMMARY OF THE INVENTION

The invention provides a power amplifier system including a plurality of amplifiers, a plurality of primary transformer windings, a single secondary transformer winding. Each of the plurality of amplifiers includes a differential input that is commonly coupled to a system input port, and each the plurality of amplifiers also includes a differential output. Each of the plurality of primary transformer windings is coupled to the differential output of one of the plurality of amplifiers. The single secondary transformer winding is inductively coupled to all of the primary transformer windings and provides a system output port to which a load may be coupled.

BRIEF DESCRIPTION OF THE DRAWING

The following description may be further understood with reference to the accompanying drawing in which.

DETAILED DESCRIPTION OF THE INVENTION

The invention provides for the distribution of the primary current of a transformer among multiple windings. This reduces the need for a large turns ratio in the transformer. Instead of one single amplifier delivering all the current, multiple amplifiers are employed to deliver the required power to the load. Uniform spatial distribution of power amplification across the circuit chip also avoids localized heating and ensures that temperature sensitive components on the chip experience the same thermal effects and maintain good matching with other similar components.

Figure 1:
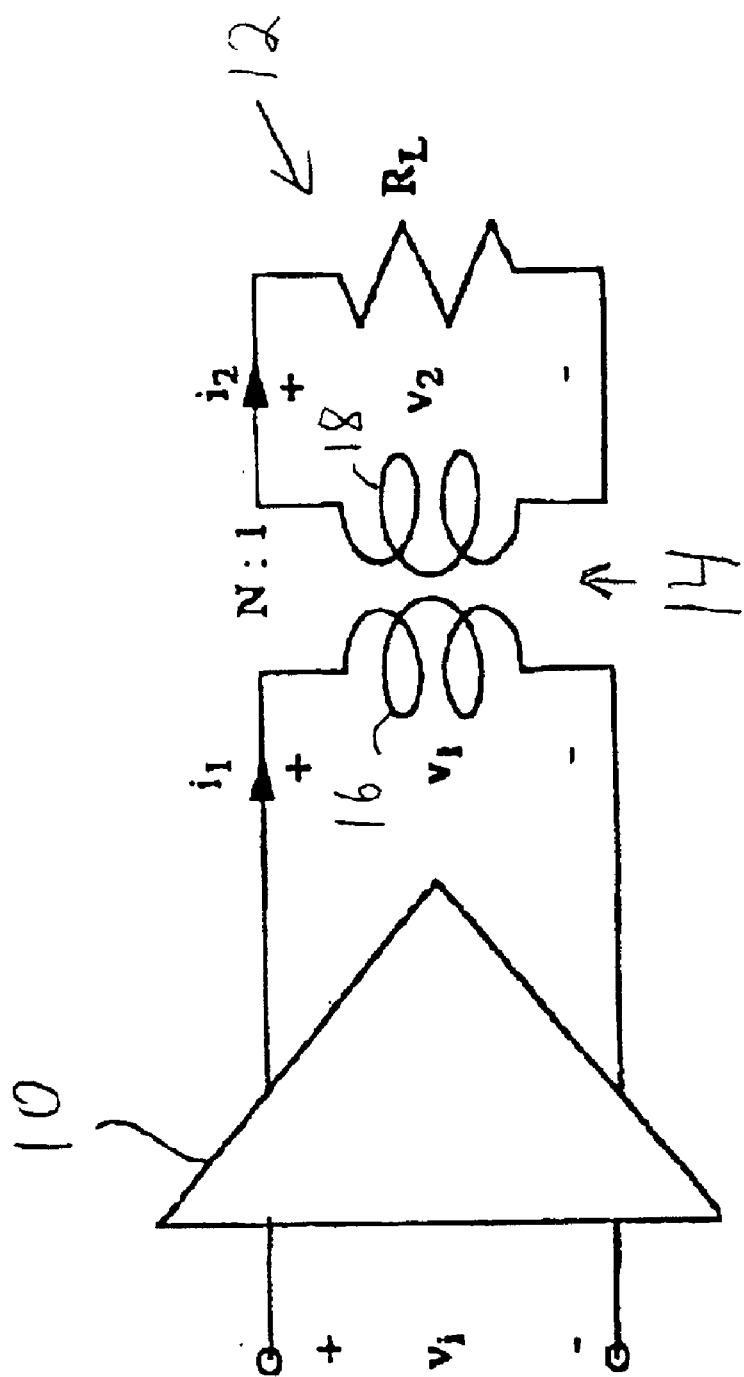
FIG. 1 shows a prior art circuit diagram for a power amplifier circuit.
Figure 2:
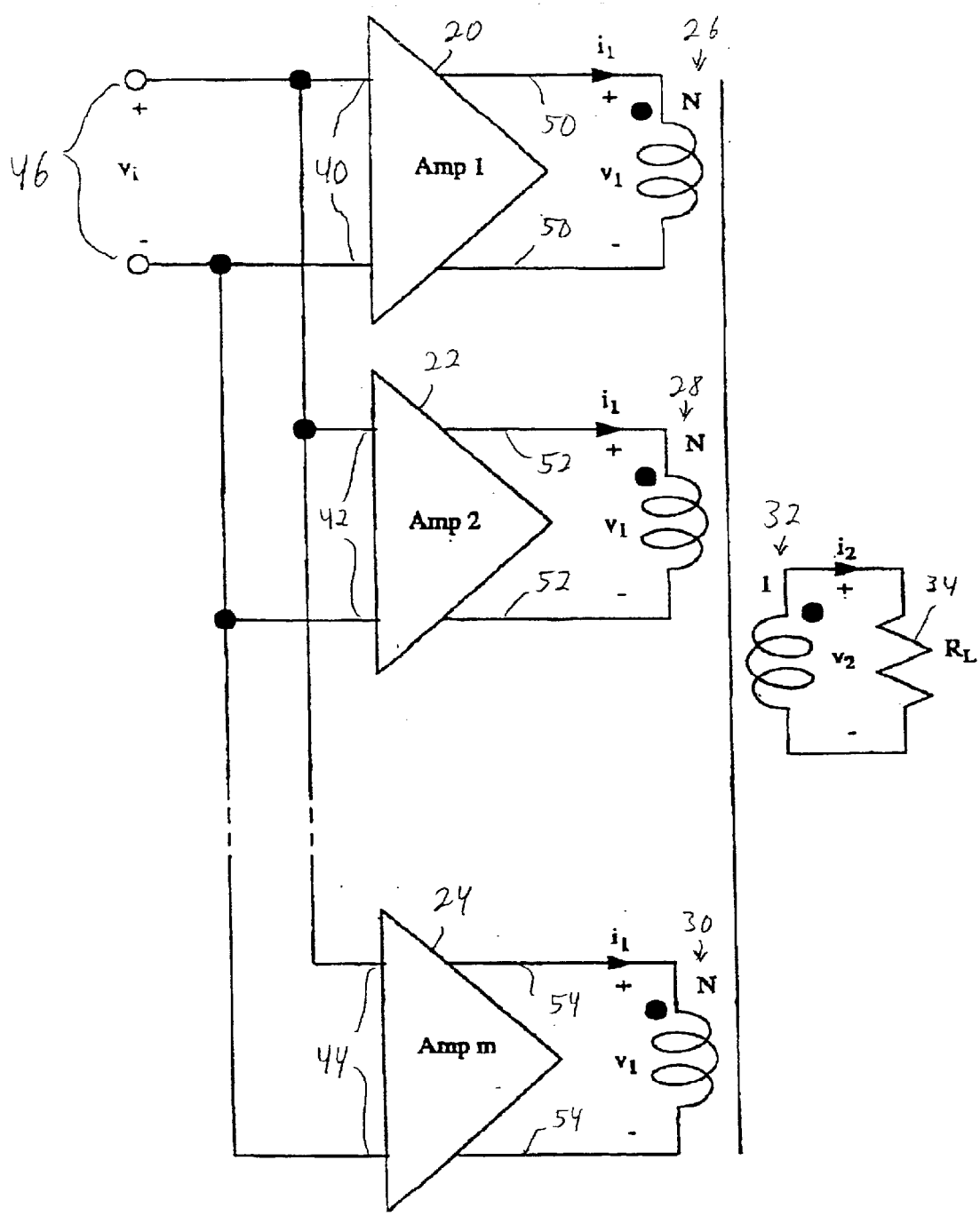
FIG. 2 shows a circuit diagram for a power amplifier circuit in accordance with an embodiment of the invention.

As shown in FIG. 2, a circuit in accordance with an embodiment of the invention provides m amplifiers 20, 22, 24 feeding m primary transformer winding 26, 28, 30 of the coupling transformer having a single secondary transformer winding 32. The turns ratio from each primary winding 26, 28, 30 to the secondary windings 32 is still N:1 as discussed above with reference to FIG. 1. Each of the amplifiers 20,22,24 includes a differential input 40,42,44 that is commonly coupled to a system input port 46, and each of the amplifiers 20,22,24 also includes a differential output 50,52, 54. Each of the primary transformer windings 26,28,30 is coupled to the differential output 50,52,54 of the amplifiers 20,22,24. The single secondary transformer winding 32 is inductively coupled to all of the primary transformer windings 26,28,30 and provides a system output port to which a load 34 may be coupled.

As explained in more detail below, the current provided by each amplifier is $i_1 = i_2/(mN)$ where $i_2$ is the current at the load 34. While the voltage and current swing requirements of each amplifier are maintained at $v_1 = Nv_2$. Each amplifier needs to provide only current $i_1$ where $i_1 = i_2/(mN)$, which is m times smaller than the current in a single-primary system of FIG. 1. Further, since each primary winding current is m times smaller than the current in a single-primary winding system with a Nm:1 turns ratio, larger gauge (thinner) wires may be utilized in the primary, and as a result, the transformer may be made smaller in both size and weight.

In accordance with an embodiment of a system of the invention, an overall power amplifier may deliver high output currents using any number of two or more (m) weaker amplifiers that are coupled to the load with an m-primary transformer. Such a system that is configured with m power amplifiers may be formed using m output stages connected in parallel. These m output stages may be distributed spatially across a circuit chip to avoid localized heating and severe thermal gradient.

Further, the use of multiple (m) output stages, each having a quiescent current of $I_Q$, coupled through m primaries of a single transformer that is coupled to a load, can achieve higher phase margin and better stability. In particular, if there are m output stages each carrying a quiescent current of $I_Q$ and each output stage is coupled to the load through one primary of an m-primary transformer, then each output stage faces a parasitic capacitance of C. On the other hand, if there is only one output stage carrying a quiescent current of $mI_Q$ and this stage is coupled to the load through the single primary of a transformer, then the output stage drives a parasitic capacitance of mC. The transformer in the first case above isolates the output stages from each other at high frequencies and as a result, each output stage has to drive its own parasitic capacitance at the GBW frequency. In a CMOS amplifier, the gain ($g_m$) of the output stage improves with the square root of the quiescent current. The effective gain $g_m$ of the output stage in the first case above, therefore, is $\sqrt{m}$ times lower than the effective gain $g_m$ of the output stage in the second case above. Also, the non-dominant pole of the amplifier for the first case above is 1/C, while that of the second case above is:

$$\frac{\sqrt{m}}{mC} = \frac{1}{\sqrt{m}\,C}$$

The non-dominant pole in the first case above, therefore, is $\sqrt{m}$ times higher than that of the second case above.

The above relationships may be shown by modeling an amplifier circuit of the invention with its Thevenin equivalent circuit comprising a voltage source $v_S$ and a series resistor $R_S$. The current provided by the amplifier $i_1$ and the current flowing into the load is $i_2$ may be determined as:

$$i_2 = \frac{N v_S}{N^2 R_L + R_S}$$

$$i_1 = \frac{i_2}{N}$$

When m amplifiers are used coupled through m primaries to the load as shown in FIG. 2, the current flowing into the load may be defined as:

$$i_2 = \frac{N v_S}{N^2 R_L + R_S/m}$$

$$i_1 = \frac{i_2}{Nm}$$

A comparison of the first and third equations above (for $i_2$) show that almost the same current that flows into the load for the circuit diagram shown in FIG. 1 as flows into the load for the circuit of FIG. 2. On the other hand, the second and fourth equations above (for $i_1$) show that the current provided by each amplifier in FIG. 2 is m times smaller than the current provided by the amplifier in FIG. 1. With the proper choice of N and m, therefore, both voltage and current requirements of the load may be realized.

A transformer may saturate if magnetic flux density (B) in the core exceeds a maximum value, $B_{MAX}$. Magnetic flux density in the core is the time integral of the voltage across the secondary divided by the number of turns in the secondary by the core cross sectional area. By using the proposed idea of m primaries of Nm turns, the magnetic flux density and the saturation limit of the transformer are intact.

Mismatch in the turns ratio from one primary to the other has a minor effect in equal distribution of the current among the amplifiers. Assuming a turns ratio of $N_{l1}$:1 (where $I=1, \ldots m$), the current flowing in the load is:

$$i_2 = \frac{\overline{N} v_S}{\overline{N}^2 R_L + R_S/m}$$

where $\overline{N}$ is the average number of turn of the primaries of the transformer. Distribution of the current among m amplifiers is proportional to the number of turns in their corresponding primary winding. Mismatch in the number of turns of primaries, therefore, does not result in significantly different power dissipation in amplifiers and mismatched local heating.

Power amplifier systems of the invention may be used in a wide variety of applications, including DSL modems. For example, in the CPE ADSL modem, the line driver should provide power up to 12.5 dBm to a twisted-pair line with input impedances as low as 100Ω. Typically, a ±12 v stand-alone bipolar line driver is used. Fabricating the line driver on the same +5 v CMOS substrate beside the rest of the analog front end is not easily feasible because of the local heating effect due to the line driver and large parasitic capacitance loading on the output stage. Sourcing and/or sinking large currents at the output requires large output transistors, which themselves contribute to large parasitic capacitance at the output. Such a driver requires a large secondary-to-primary turns ratio (e.g., as large as 2.5), which in turn leads to very large currents in the driver. The local heating due to this large current might lead to reliability issues and temperature gradient effects across the circuit chip. Taking advantage of the readily available two (or four) primaries of the hybrid transformer could lead to distribution of power among two (or four) amplifiers placed on two (or four) edges of the chip.

Those skilled in the art will appreciate that numerous modifications and variations may be made to the above embodiments without departing from the spirit and scope of the invention.

What is claimed is:

1. A power amplifier system comprising:
   a plurality of amplifiers, each of which includes an input that is commonly coupled to a system input port, and each of which includes an output;
   a plurality of primary transformer windings, each of which is coupled to the output of one of the plurality of amplifiers; and
   a single secondary transformer winding that is inductively coupled to all of said primary transformer windings and sums coupled flux from each of said primary transformer windings and which provides a system output port to which a load may be coupled.

2. A power amplifier system as claimed in claim 1, wherein said each of said primary transformer windings provides at least substantially the same number N of winding turns so that the turns ratio from each primary transformer winding to the secondary transformer winding is N:1.

3. A power amplifier system as claimed in claim 2, wherein the current provided by each amplifier is $i_1 = i_2/(mN)$ where $i_2$ is the current in the secondary transformer winding, and m is the number of the plurality of primary transformer windings.

4. A power amplifier as claimed in claim 2, wherein each of said primary transformer windings provides exactly the same number N of winding turns.

5. A power amplifier system as claimed in claim 2, wherein said system permits mismatch in the number of turns of each of said primary transformer windings.

6. A power amplifier system as claimed in claim 1, wherein said plurality of amplifiers are spatially distributed on a circuit board to reduce localized heating on the circuit board.

7. A power amplifier system as claimed in claim 1, wherein system includes two primary transformer windings.

8. A power amplifier system as claimed in claim 1, wherein said system includes three primary transformer windings.

9. A power amplifier system as claimed in claim 1, wherein said system includes four primary transformer windings.

10. A power amplifier system comprising:
    a plurality of m amplifiers, each of which includes an input that is commonly coupled to a system input port, and each of which includes an output;
    a plurality of m primary transformer windings, each of which has substantially the same number N of windings, and each of which is coupled to the output of one of the plurality of amplifiers; and a single secondary transformer winding that is inductively coupled to all of said primary transformer windings and sums coupled flux from each of said primary transformer windings such that the turns ratio from each primary transformer winding to the secondary transformer winding is N:1.

11. A power amplifier system as claimed in claim 10, wherein the current provided by each amplifier is $i_1=i_2/(mN)$ where $i_2$ is the current in the secondary transformer winding.

12. A power amplifier system comprising:

a plurality of m primary transformer windings, each of which has substantially the same number N of windings;

at least two amplifiers, each of which includes an input that is coupled to a system input port and includes an output that is coupled to at least one of said plurality of m primary transformer windings; and a single secondary transformer winding that is inductively coupled to all of said primary transformer windings and sums coupled flux from each of said primary transformer windings such that the turns ratio from each primary transformer winding to the secondary transformer winding is N:1.

13. A power amplifier system as claimed in claim 12, wherein the current provided to each primary transformer winding is $i_1=i_2/(mN)$ where $i_2$ is the current in the secondary transformer winding.

14. A power amplifier system as claimed in claim 12, wherein said system further includes a plurality of m amplifiers that are spatially distributed on a circuit board to reduce localized heating on the circuit board.

15. A power amplifier system comprising:

a plurality of m primary transformer windings, each of which has substantially the same number N of windings; and a single secondary transformer winding that is inductively coupled to all of said primary transformer windings and sums coupled flux from each of said primary transformer windings such that the turns ratio from each primary transformer winding to the secondary transformer winding is N:1, wherein said system further includes a plurality of amplifiers, each of which is coupled to one of the plurality of primary transformer windings.

16. A power amplifier system comprising:

a first primary transformer winding including a positive input port and a negative input port for providing a first current through said first primary transformer winding in a first positive direction, said first primary transformer winding being coupled to a first amplifier;

a second primary transformer winding including a positive input port and a negative input port for providing a second current through said second primary transformer winding in a second positive direction, said second primary transformer winding being coupled to a second amplifier;

a secondary transformer winding that includes a positive output port and a negative output port and receives an inductively coupled current from said first and second primary transformer windings; and power amplifier circuitry that includes said first and second amplifiers and couples said first and second primary transformer windings and said secondary transformer winding such that said first and second positive directions are the same with respect to said secondary transformer winding, providing a summation of said first and second currents at said secondary transformer winding.

17. A power amplifier system as claimed in claim 1, wherein said plurality of amplifiers are spatially distributed on an integrated circuit chip to reduce localized heating on the integrated circuit chip.

18. A power amplifier system as claimed in claim 12, wherein said system further includes a plurality of amplifiers that are spatially distributed on an integrated circuit chip to reduce localized heating on the integrated circuit chip.

19. A power amplifier system as claimed in claim 1, wherein said input to each of said amplifiers is a differential input.

20. A power amplifier system as claimed in claim 1, wherein said output of each of said amplifiers is a differential output.

* * * * *